United States Patent
Chang

(10) Patent No.: US 9,312,892 B2
(45) Date of Patent: Apr. 12, 2016

(54) DIGITAL PRE-DISTORTION CIRCUIT AND METHOD, AND DIGITAL PRE-DISTORTION TRAINING CIRCUIT

(71) Applicant: REALTEK SEMICONDUCTOR CORPORATION, Hsinchu (TW)

(72) Inventor: Yu-Ping Chang, Tainan (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 14/668,579

(22) Filed: Mar. 25, 2015

(65) Prior Publication Data

US 2016/0036472 A1 Feb. 4, 2016

(30) Foreign Application Priority Data

Jul. 31, 2014 (TW) .............................. 103126308 A

(51) Int. Cl.
*H04L 25/03* (2006.01)
*H04B 1/04* (2006.01)

(52) U.S. Cl.
CPC ...... *H04B 1/0475* (2013.01); *H04B 2001/0425* (2013.01); *H04B 2001/0433* (2013.01); *H04B 2001/0441* (2013.01)

(58) Field of Classification Search
CPC ..................... H04B 1/0475; H04B 2001/0425; H04B 2001/0433; H04B 2001/0441
See application file for complete search history.

(56) References Cited

U.S. PATENT DOCUMENTS

| | | | | |
|---|---|---|---|---|
| 6,757,525 | B1* | 6/2004 | Ishikawa ............... | H03F 1/3247 330/149 |
| 2002/0186783 | A1* | 12/2002 | Opas ..................... | H03F 1/3294 375/297 |
| 2006/0215783 | A1* | 9/2006 | Shako ................... | H03F 1/3241 375/296 |
| 2010/0054364 | A1* | 3/2010 | Cai ....................... | H03F 1/3247 375/296 |
| 2012/0321018 | A1* | 12/2012 | Chen .................... | H03F 1/3247 375/296 |

(Continued)

FOREIGN PATENT DOCUMENTS

| CN | 101505139 | 8/2011 |
|---|---|---|
| CN | 102427438 | 4/2012 |

OTHER PUBLICATIONS

Duc Nguyen, Cholesky and LDL Decomposition, http://numericalmethods.eng.usf.edu, Jul. 29, 2010.

(Continued)

*Primary Examiner* — Dac Ha
(74) *Attorney, Agent, or Firm* — WPAT, P.C., Intellectual Property Attorneys; Anthony King

(57) ABSTRACT

The present invention discloses a digital pre-distortion circuit capable of compensating an analog circuit for its non-linear characteristic. An embodiment of said digital pre-distortion circuit comprises: a pre-distortion training circuit and a pre-distortion circuit. Said pre-distortion training circuit is operable to process a digital feedback signal according to a Cholesky Decomposition related algorithm and thereby generate a plurality of coefficients in which the digital feedback signal is derived from an output signal of the analog circuit and the output signal of the analog circuit is derived from an original digital signal; and said pre-distortion circuit is operable to process the original digital signal according to the plurality of coefficients under a compensation mode and thereby generate a digital pre-distortion signal whose non-linear characteristic is able to compensate the non-linear characteristic of the analog circuit.

15 Claims, 11 Drawing Sheets

(56) References Cited

U.S. PATENT DOCUMENTS

2014/0254716 A1* 9/2014 Zhou .................... H03F 1/3247
375/296
2015/0256216 A1* 9/2015 Ding ........................ H04B 1/62
375/297

OTHER PUBLICATIONS

Lei Ding et al., Memory Polynomial Predistorter Based on the Indirect Learning Architecture, IEEE, 2002, pp. 967-971.
Na, Applied Signal Processing, 2004, pp. 1-19.
Hu Xin et al., Wideband Adaptive Predistortion Algorithm Based on LUT and Memory-effect Compensation Techniques, Journal of Electronics & Information Technology, vol. 34 No. 3, Mar. 2012, pp. 733-738.
Office Action of the counterpart Taiwan application 103126308 dated Jan. 7, 2016.
Search report of the counterpart Taiwan application 103126308 dated Jan. 7, 2016.
English abstract translation of the Office Action of the counterpart Taiwan application 103126308 dated Jan. 7, 2016.

* cited by examiner

DIGITAL PRE-DISTORTION CIRCUIT AND METHOD, AND DIGITAL PRE-DISTORTION TRAINING CIRCUIT

BACKGROUND OF THE INVENTION

1. Field of the Invention

The present invention relates to a circuit and method capable of compensating for a non-linear characteristic, especially to a digital pre-distortion circuit and method and a digital pre-distortion training circuit capable of compensating for the non-linear characteristic of an analog circuit.

2. Description of Related Art

Generally speaking, an analog circuit including a non-linear element (e.g., a transistor) has the problem of obvious non-linear output distortion under certain operation conditions. For instance, take a power amplifier (PA) that is usually used in a transmitter of a communication system for example; if the amplitude of an input signal goes beyond the linear region of the power amplifier, a non-linear distortion will occur in the power amplifier's output signal, and the distortion of signals falling within a current frequency band and the interference to signals falling within a neighboring frequency band will occur as well. Moreover, in some wireless communication broadband OFDM (Orthogonal Frequency Division Multiplexing) system, a power amplifier of a high rating not only has the problem of non-linearity, but also the problem of memory effects, which means that the output of the power amplifier at the moment will correlate with the output of the power amplifier at the previous moment. These problems make the compensation of non-linearity quite difficult.

Regarding linearization techniques for a power amplifier, the feedforward technique, the negative feedback technique and the linear pre-distortion technique are popular nowadays, among which the linear pre-distortion technique is widely used, good at cost, efficiency and stability, and quite practicable. Accordingly, some people developed an analog radio-frequency pre-distortion technique; unfortunately, because the radio-frequency pre-distortion involves radio-frequency non-linear active elements and the parameter adjustments thereof, this technique faces the problem of high design complexity. Besides, some people developed a digital pre-distortion (DPD) technique which construes a pre-distortion configuration according to Volterra Series and the modification thereof or the simplified memory polynomial (MP) thereof (that is to say the memory polynomial operable to represent the non-linearity characteristic of a power amplifier) and the DPD technique can be realized through hardware such as a look-up table (LUT) or a polynomial calculating circuit.

However, the mentioned look-up table requires a lot of memory space and is short of precision due to cost concern, while the mentioned polynomial calculating circuit requires a lot of calculation resource to determine many coefficients when the depth of memory effects is serious and the order of the memory polynomial is high. In consideration of cost, some people proposed using Least Mean Square (LMS) calculation for substitutions and convergence to determine the said coefficients. But LMS calculation is usually accompanied with the problem of poor convergence and stability because of the inappropriate setting of step for convergence (while an overly wider step makes convergence hard or unable to be achieved, and an overly narrower step consumes too much calculation resource and time), and also consumes a lot of chip area which is definitely not cost effective.

The digital pre-distortion technique making use of memory polynomial and examples of the said look-up table can be found in the following documents:

(1) Lei Ding, G. Tong Zhou, Dennis R. Morgan, Zhengxiang Ma, J. Stevenson Kenny, Joehyeong Kim, Charles R. Giardina, "MEMORY POLYNOMIAL PREDISTORTER BASED ON THE INDERECT LEARNING ARCHITECTURE", School of Electrical and Computer Engineering of Georgia Institute of Technology in Atlanta, No. 0-7803-7632-3/02, IEEE, 2002.

(2) Hu Xin, Wang Gang, Wang Zi-Cheng, Luo Ji-Run, "Wideband Adaptive Predistortion Algorithm Based on LUT and Memory-Effect Compensation Techniques", Vol. 34, No. 3, Journal of Electronics & Information Technology, March 2012.

SUMMARY OF THE INVENTION

An object of the present invention is to provide a digital pre-distortion circuit and method capable of making improvements over the prior arts.

The present invention discloses a digital pre-distortion circuit capable of compensating an analog circuit for its non-linear characteristic. An embodiment of the digital pre-distortion circuit comprises: a pre-distortion training circuit operable to process a digital feedback signal according to a Cholesky Decomposition related algorithm and thereby generate a plurality of coefficients in which the digital feedback signal is derived from an output signal of the analog circuit and the output signal of the analog circuit is derived from an original digital signal; and a pre-distortion circuit, including the pre-distortion training circuit or being independent of the pre-distortion training circuit, operable to process the original digital signal according to the plurality of coefficients under a compensation mode and thereby generate a digital pre-distortion signal, wherein the non-linear characteristic of the digital pre-distortion signal is operable to compensate the non-linear characteristic of the analog circuit and thereby make the output signal of the analog circuit conform to a predetermined characteristic.

The present invention also discloses a digital pre-distortion method which is carried out by the digital pre-distortion circuit of the present invention and capable of compensating for the non-linear characteristic of an analog circuit. An embodiment of the method comprises the following steps: processing a digital feedback signal according to a Cholesky Decomposition related algorithm to thereby generate a plurality of coefficients in which the digital feedback signal is derived from an output signal of the analog circuit and the output signal of the analog circuit is derived from an original digital signal; and processing the original digital signal according to the plurality of coefficients under a compensation mode to thereby generate a digital pre-distortion signal, wherein the non-linear characteristic of the digital pre-distortion signal is operable to compensate for the non-linear characteristic of the analog circuit and thereby make the output signal of the analog circuit conform to a predetermined characteristic.

The above-mentioned digital pre-distortion training circuit can be implemented independently. Therefore the present invention further discloses a digital pre-distortion training circuit. An embodiment of the training circuit comprises: a pre-distortion training circuit operable to process a digital feedback signal according to a modified Cholesky Decomposition algorithm and thereby generate a plurality of coefficients, wherein the digital feedback signal is derived from an output signal of an analog circuit and the plurality of coefficients is operable to compensate the analog circuit for its non-linear characteristic.

These and other objectives of the present invention will no doubt become obvious to those of ordinary skill in the art after

DETAILED DESCRIPTION OF THE PREFERRED EMBODIMENTS

The following description is written by referring to terms of this invention field. If any term is defined in this specification, such term should be explained accordingly.

The present invention includes a digital pre-distortion circuit and method and a digital pre-distortion training circuit. These circuits and methods are operable to compensate an analog circuit (e.g., a power amplifier) for its non-linear characteristic in an effective and economic manner while giving consideration to the memory effect of the said analog circuit. The present invention is applicable to any circuit having a non-linear characteristic. Provided that an alternative means is available and reasonable, people of ordinary skill in the art can use such means similar or equivalent to that described in this specification to carry out the present invention. The circuit of the present invention may include a well-known element and the detail description of such element will be omitted if this omission has nothing to do with the understanding and enablement of the present invention. The method of the present invention could be in the form of software and/or firmware, and may be executed by the circuit of the present invention or its equivalent. Please note that if an implementation derived from one or more of the following embodiments is practicable, a person of ordinary skill in the art can selectively make use of some or all of the features in one embodiment or selectively make use of the combination of some or all features in several embodiments to have the implementation come true, so as to increase the flexibility of carrying out the present invention.

Figure 1:
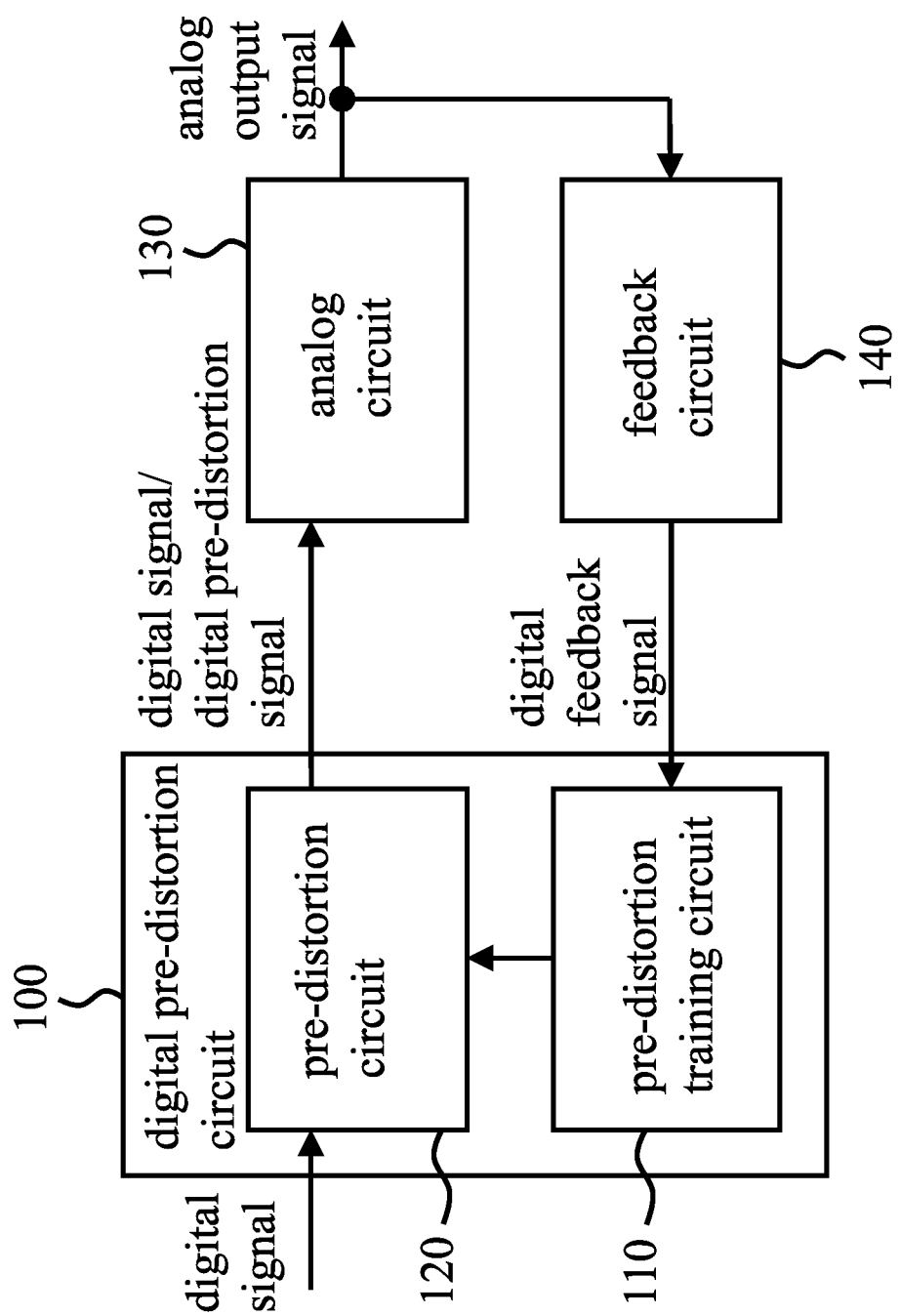
FIG. 1 illustrates an embodiment of the digital pre-distortion circuit of the present invention.
Figure 2:
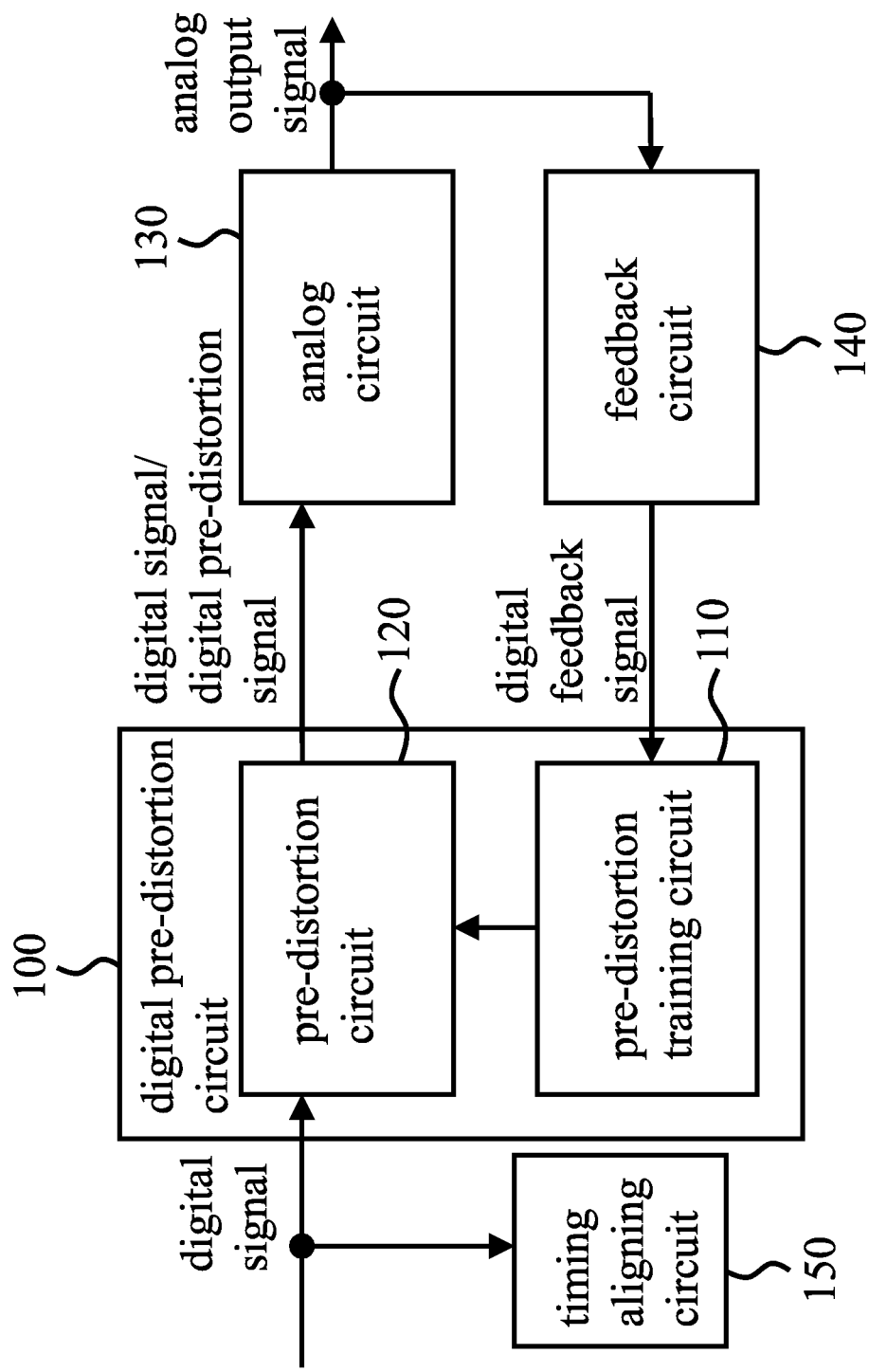
FIG. 2 illustrates another embodiment of the digital pre-distortion circuit of the present invention.

FIG. 1 illustrates an embodiment of the digital pre-distortion circuit of the present invention. As it shown in FIG. 1, the digital pre-distortion circuit 100 comprises a pre-distortion training circuit 110 and a pre-distortion circuit 120, and may further comprise the following circuits or cooperate with them: an analog circuit 130 and a feedback circuit 140. The said pre-distortion training circuit 110 is operable to process a digital feedback signal according to a Cholesky Decomposition related algorithm and thereby generate a plurality of coefficients. The said pre-distortion circuit 120, being integrated with the pre-distortion training circuit 110 or independent of the pre-distortion training circuit 110, operable to process an original digital signal according to the plurality of coefficients under a compensation mode and thereby generate a digital pre-distortion signal. The said analog circuit 130 is operable to generate an analog output signal according to the original digital signal under a normal mode, or generate the analog output signal according to the digital pre-distortion signal under the compensation mode in which the non-linear characteristic of the digital pre-distortion signal is operable to compensate for the non-linear characteristic of the analog circuit 130 and thereby make the analog output signal of the analog circuit 130 conform to a predetermined characteristic (e.g., a linear characteristic or a characteristic abiding by some known specification). Besides, if the output signal of the analog circuit 130 is derived from the digital pre-distortion signal, the pre-distortion training circuit 110 is further operable to update the plurality of coefficients according to the digital feedback signal, so that the coefficients adopted by the pre-distortion circuit 120 can be updated consequently; however, this function is optional and implementer's discretion is advised. As to the said feedback circuit 140, it is operable to generate the mentioned digital feedback signal according to the output signal of the analog circuit 130. In addition, as it is shown in FIG. 2, the digital pre-distortion circuit 100 may further comprise the following circuit or cooperate with it: a timing aligning circuit 150 operable to verify a timing relation between the original digital signal and the digital feedback signal, which allows the pre-distortion training circuit 110 to process the digital feedback signal according to the timing relation and generate the plurality of coefficients accordingly. Because each of the analog circuit 130, the feedback circuit 140 and the timing aligning circuit 150 alone can be carried out through a known or self-developed circuit by those of ordinary skill in the art, the detail description of one single circuit is therefore omitted while the existing description is believed to be enough for understanding and enablement of the present invention.

The said Cholesky Decomposition related algorithm could be the Cholesky Decomposition algorithm, the modified Cholesky Decomposition algorithm or an algorithm derived from the two kinds of algorithms. The modified Cholesky Decomposition algorithm is usually denoted by $LDL^H$, and capable of representing an original matrix (e.g., the pre-distortion transformation matrix H in the following description) with a matrix equation (i.e., $LDL^H$) in which L stands for a lower triangular matrix, D stands for a diagonal matrix and $L^H$ stands for the conjugate transpose matrix of L (a.k.a. upper triangular matrix). The Cholesky Decomposition algorithm and the modified Cholesky Decomposition algorithm are well known in this field, and the former needs to calculate a square root while the later only needs to do the four fundamental operations of arithmetic. Since the four fundamental operations are easier to be carried out with hardware circuits, the present embodiment employs the modified Cholesky Decomposition algorithm and the detail thereof is described in the following paragraphs. However, people of ordinary skill in the art may employ other Cholesky Decomposition related algorithms with proper circuits. The explanation of the Cholesky Decomposition algorithm and the modified Cholesky Decomposition algorithm can be found in the following document: Duc Nguyen, "Cholesky and $LDL^T$ Decomposition", Chapter 04.11, Jul. 29, 2010.

Please refer to FIG. 1 again. In this embodiment, the pre-distortion training circuit 110 is operable to process the digital feedback signal according to the modified Cholesky Decomposition algorithm and carry out at least the following steps:

Step S110: According to the digital feedback signal x(t) (t is an integer between 1 and T and indicates the $t^{th}$ digital feedback signal), the order (2p−1) (p is a positive integer) of a predetermined memory polynomial and the depth q (q is an integer between 0 and Q while Q is an integer no less than 0 and associated with the number of processing paths of the pre-distortion circuit 120 in FIG. 8) of a predetermined memory effect, a pre-distortion transformation matrix H is obtained as follows:

$$H_q = \begin{bmatrix} h_{1,q}(t) & h_{3,q}(t) & \ldots & h_{2p-1,q}(t) \\ h_{1,q}(t+1) & h_{3,q}(t+1) & \ldots & h_{2p-1,q}(t+1) \\ \vdots & \vdots & \vdots & \vdots \\ h_{1,q}(t+T-1) & h_{3,q}(t+T-1) & \ldots & h_{2p-1,q}(t+T-1) \end{bmatrix}$$

$$H = [H_0 \cdot H_1 \cdot H_2 \cdot \ldots \cdot H_Q]$$

The pre-distortion transformation matrix H reflects the distortion (i.e., the relation between the input signal of the analog circuit 130 and the digital feedback signal) caused by the analog circuit 130; the parameter T in the matrix is associated with the number of the digital feedback signal(s) x(t) processed by the pre-distortion training circuit 110; and each matrix factor $h_{2p-1,q}(m)$ (m=t~(t+T−1)) can be derived from the following equation:

$$h_{2p-1,q}(m) = |x(t-q)|^{2(p-1)} x(t-q)$$

Figure 3:
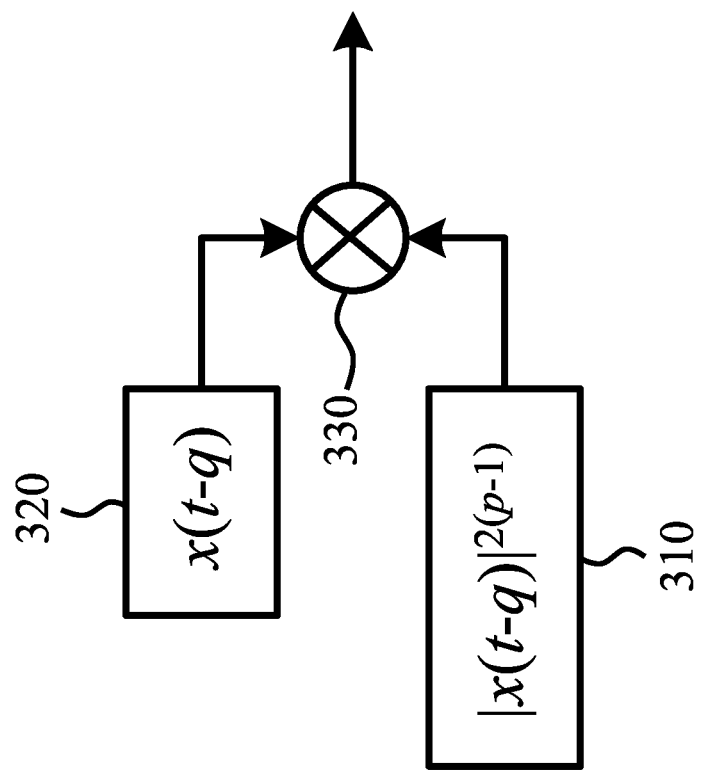
FIG. 3 illustrates an embodiment of the circuit operable to calculate matrix factors according to the present invention.

The matrix factor calculation of the above equation can be carried out by the circuit of FIG. 3 or the equivalent thereof, and can also be carried out by some other known calculating circuit (e.g., a field programmable gate array (FPGA), a microprocessor, or an application-specific integrated circuit (ASIC)). The circuit of FIG. 3 includes: a circuitry unit 310 operable to generate $|x(t-q)|^{2(p-1)}$, a circuitry unit 320 operable to generate $x(t-q)$, and a multiplier 330 operable to multiply $|x(t-q)|^{2(p-1)}$ by x(t-q).

Step S120: doing a calculation according to the conjugate matrix $H^H$ of the pre-distortion transformation matrix H, the pre-distortion transformation matrix H and the original digital signal Y to thereby obtain a calculation result. More specifically, because the pre-distortion training circuit 110 needs the pre-distortion transformation matrix H (which is determined in accordance with the feedback signal x(t)) and the original digital signal Y to derive the plurality of coefficients c for the generation of pre-distortion, it will derive the calculation result of $H^H H$ and HY first, and the process of deriving the coefficients c can be expressed with the following equations:

$$H_{T \times n} c_{n \times 1} = Y_{T \times 1}$$

$$(H_{n \times T}{}^H H_{T \times n}) c_{n \times 1} = H_{n \times T}{}^H Y_{T \times 1}$$

$$\Rightarrow (L_{n \times n} D_{n \times n} L_{n \times n}{}^H) c_{n \times 1} = H_{n \times T}{}^H Y_{T \times 1}$$

$$\Rightarrow A_{n \times n} c_{n \times 1} = b_{n \times 1}$$

Figure 4:
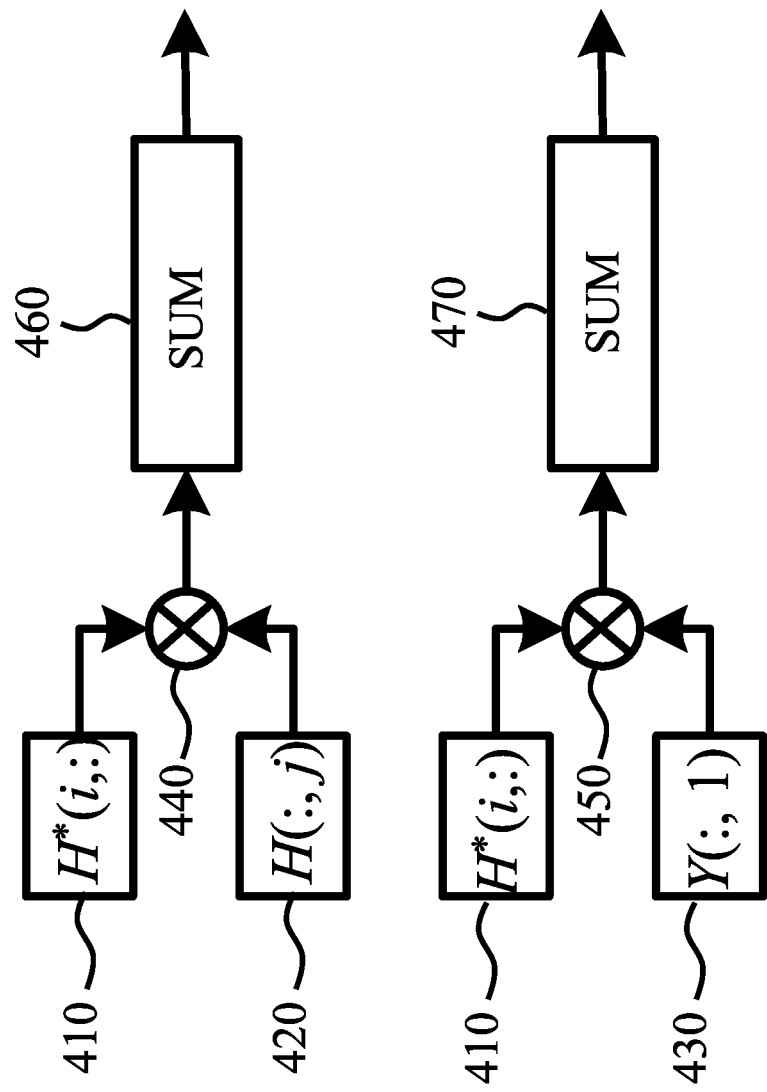
FIG. 4 illustrates an embodiment of the circuit operable to do matrix calculation according to the present invention.

In the above equations the suffixes of the variables H, $H^H$, c, Y, L, D, $L^H$, A, b denote the size of matrix dimension, the suffix variable T has been defined in the description of step S110, the suffix variable n is an integer more than 1, the definitions of L, D, $L^H$ are the lower triangular matrix, the diagonal matrix and the upper triangular matrix respectively, the matrix A is equivalent to $L \cdot D \cdot L^H$, and the matrix $b_{n \times 1}$ is equivalent to the matrix $A_{n \times n}$ multiplied by the coefficient matrix $c_{n \times 1}$. Since step S110 has derived the pre-distortion transformation matrix H and the original digital signal Y is a given signal, step S120 can obtain the wanted calculation result by calculating ($H^H \cdot H$) and $H^H \cdot Y$. Step S120 can be carried out through the circuit of FIG. 4 or the equivalent thereof, and can be carried out through some other known calculating circuit (e.g., FPGA, microprocessor or ASIC). The circuit of FIG. 4 includes: a circuitry unit 420 operable to provide each factor H(:, j) of the matrix H in which j indicates the column number of matrix; a circuitry unit 410 operable to provide each factor H*(i,:) of the matrix H in which i indicates the row number of matrix; a circuitry unit 430 operable provide each factor Y(:, 1) of the matrix Y; a multiplying unit 440 operable to multiply the matrix factor H(:, j) by the matrix factor H*(i,:); a multiplying unit 450 operable to multiply the matrix factor H*(i,:) by the matrix factor Y(:, 1); an adding unit 460 (SUM) operable to add the multiplication results of the matrix factors H(:, j) and H*(i,:); and an adding unit 470 (SUM) operable to add the multiplication results of the matrix factors H*(i,:) and Y(:, 1).

Figure 8:
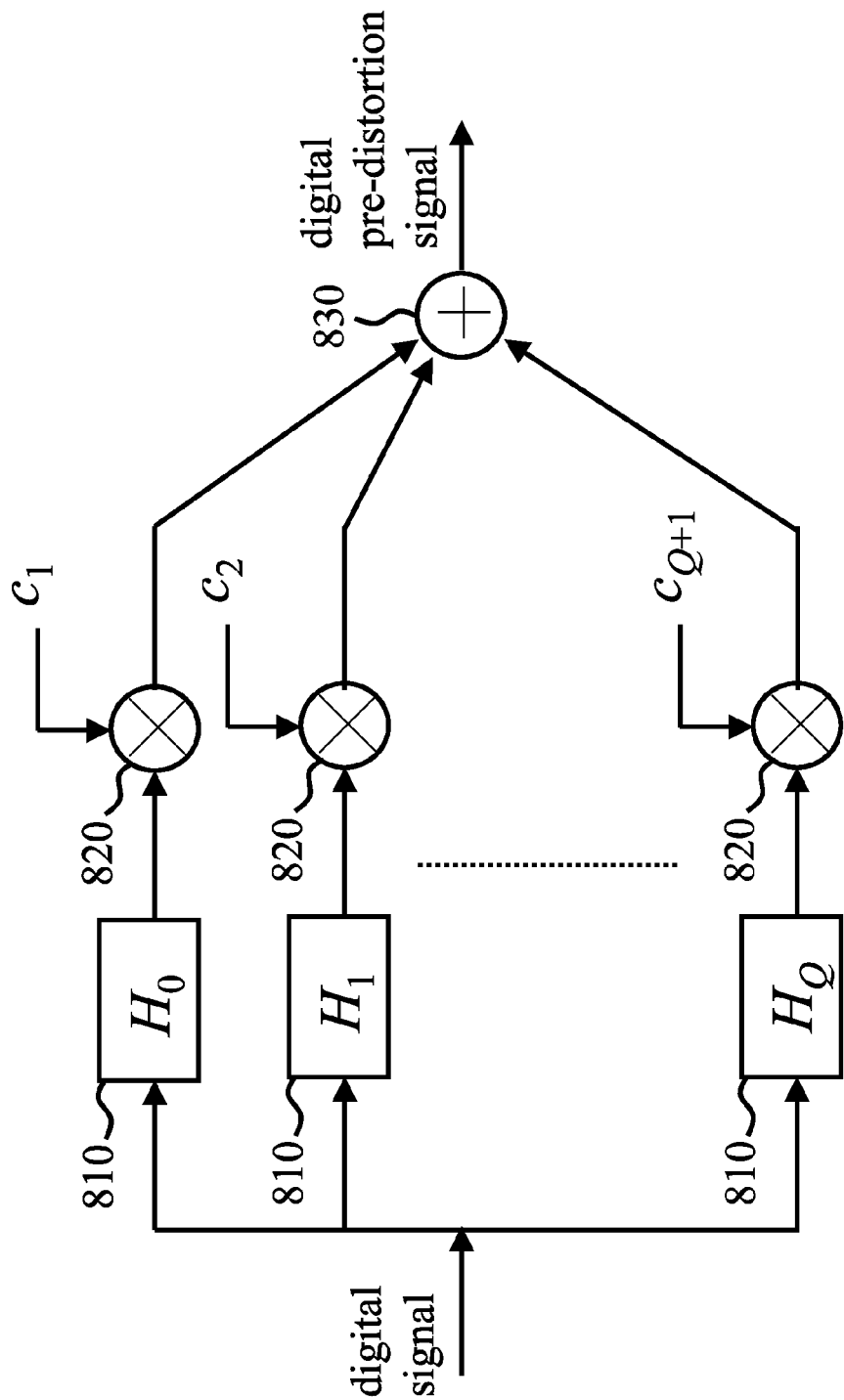
FIG. 8 illustrates an embodiment of the pre-distortion circuit of FIG. 1.

Step S130: processing the above-mentioned calculation result according to the modified Cholesky Decomposition algorithm to thereby obtain the plurality of coefficients (e.g., the weighted coefficient $c_{q+1}$ (q=0~Q) of each processing path in the pre-distortion circuit 120 of FIG. 8). More specifically, step S130 includes the following sub steps:

Step S132: calculating a plurality of calculation values $d_{jj}$, $l_{ij}$ according to the calculation result $(H^H \cdot H) = L \cdot D \cdot L^H = A$ in which $d_{jj}$ is the matrix factor of the diagonal matrix D, $l_{ij}$ is the matrix factor of the lower triangular matrix L, and i, j are the row number and column number of matrix respectively. In detail, $d_{jj}$ and $l_{ij}$ can be derived from the following equations:

$$d_{jj} = a_{jj} - \sum_{k=1}^{j-1} l_{jk} l_{jk}^* d_{kk}$$

$$l_{ij} = \left( a_{ij} - \sum_{k=1}^{j-1} l_{jk} l_{jk}^* d_{kk} \right) / d_{jj}$$

wherein $a_{jj}$ and $a_{ij}$ are the matrix factors of the matrix A and the symbol * denotes conjugate transposition.

Figure 5:
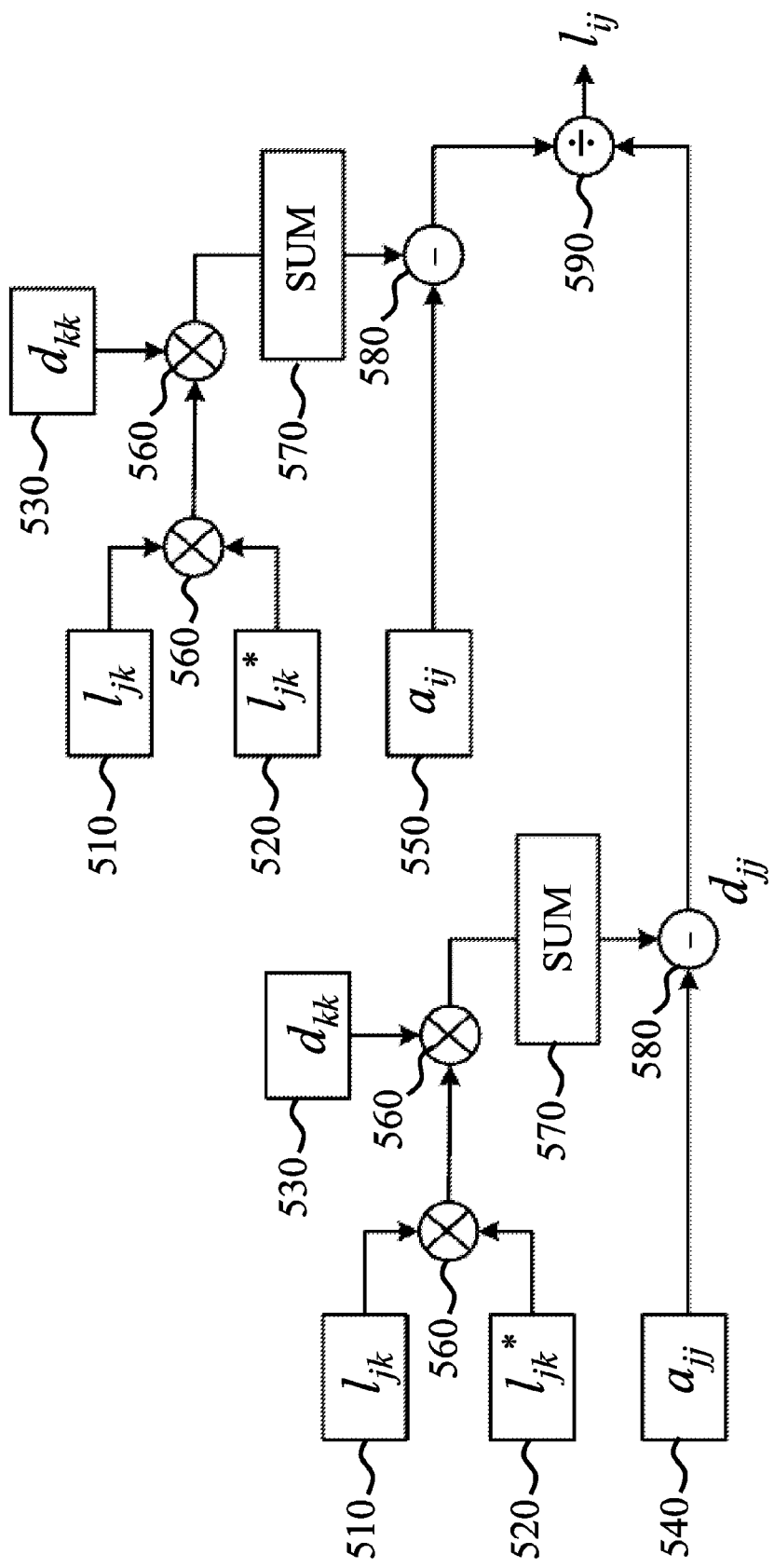
FIG. 5 illustrates an embodiment of the circuit operable to calculate calculation values according to the present invention.

The calculation of these calculation values can be done by the circuit of FIG. 5 or the equivalent thereof, and can also be done by some other existing circuit (e.g., FPGA, microprocessor, or ASIC). The circuit of FIG. 5 includes: a circuitry unit 510 operable to provide $l_{ik}$; a circuitry unit 520 operable to provide $l_{ik}^*$; a circuitry unit 530 operable to provide $d_{kk}$; a circuitry unit 540 operable to provide $a_{jj}$; a circuitry unit 550 operable to provide $a_{ij}$; a multiplying unit 560 operable to do multiplication to its input values; an adding unit 570 (SUM) operable to add up $l_{ik} l_i^* d_{kk}$ (in which k is equal to 1~j−1); a subtracting unit 580 operable to subtract $a_{jj}$ or $a_{ij}$ from the summation $l_{ik}l_{ik}{}^*d_{kk}$ (or subtract $l_{ik}l_{ik}{}^*d_{kk}$ from $a_{jj}$ or $a_{ij}$); and a divisional unit 590 operable to carry out $$\left(a_{ij}-\sum_{k=1}^{j-1}l_{jk}l_{jk}^*d_{kk}\right)\bigg/d_{jj}\text{ to generate }l_{ij}.$$

Step S134: executing Forward Substitution to process the plurality of calculation values, and thereby obtaining a plurality of values $s_w$ corresponding to the digital feedback signal. More specifically, since L (i.e., the aforementioned lower triangular matrix) and $b_w = H^H \cdot Y_t$ (as illustrated in the equations of step S120 in which w=1~n; t=1~T) are known, the following equation is held true:

[L][Z]=[B], that is to say $$\begin{bmatrix}1 & 0 & \cdots & 0\\ l_{21} & 1 & \cdots & 0\\ \vdots & \vdots & \vdots & \vdots\\ l_{n1} & l_{n2} & \cdots & 1\end{bmatrix}\begin{bmatrix}z_1\\z_2\\\vdots\\z_n\end{bmatrix}=\begin{bmatrix}b_1\\b_2\\\vdots\\b_n\end{bmatrix}$$

According to the above equation, if w=1, the value $z_1 = b_1$; and if w>1 (i.e., w=2~n), the value $z_w$ can be represented by the following equation:

$$z_w = b_w - \sum_{h=1}^{w-1} l_{wh} z_h$$

Afterwards, since D (i.e., the aforementioned diagonal matrix) is known, the following equation is held true:

[D][S]=[Z], that is to say:

$$\begin{bmatrix}d_{11} & 0 & \cdots & 0\\ 0 & d_2 & \cdots & 0\\ \vdots & 2\vdots & \vdots & \vdots\\ 0 & 0 & \cdots & d_m\end{bmatrix}\begin{bmatrix}s_1\\s_2\\\vdots\\s_n\end{bmatrix}=\begin{bmatrix}z_1\\z_2\\\vdots\\z_n\end{bmatrix}$$

According to the above equation, the value $s_w$ can be represented by the following equation:

$s_w = z_w / d_{ww}$

Figure 6:
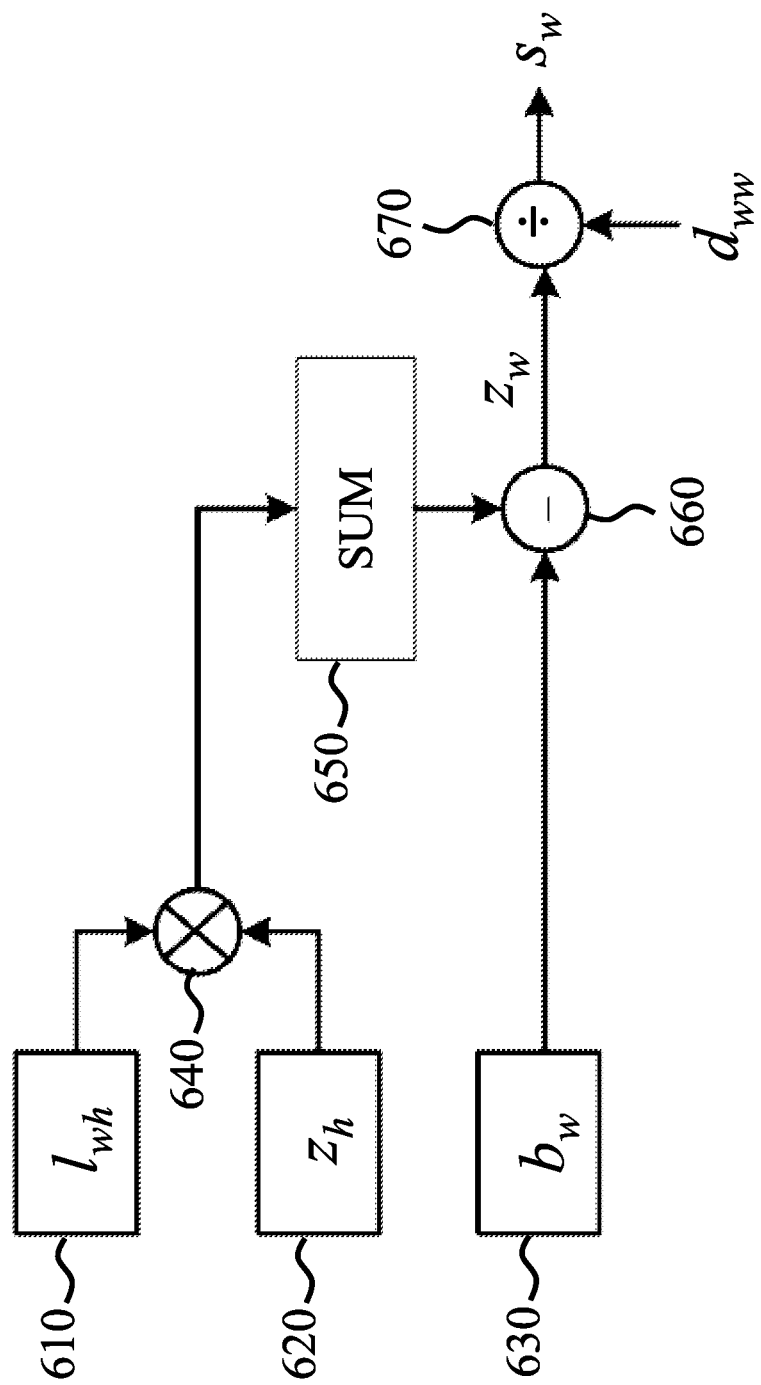
FIG. 6 illustrates an embodiment of the circuit operable to execute Forward Substitution according to the present invention.

The calculation of this step can be done through the circuit of FIG. 6 or the equivalent thereof, and can also be done through some other existing circuit (e.g., FPGA, microprocessor, or ASIC). The circuit of FIG. 6 includes: a circuitry unit 610 operable to provide $l_{wh}$; a circuitry 620 unit operable to provide $z_h$ that is outputted formerly; a circuitry unit 630 operable to provide $b_w$; a multiplying unit 640 operable to multiply $l_{wh}$ by $z_h$; an adding unit 650 (SUM) operable to add up $l_{wh}z_h$ (in which h is equal to 1~w−1); an subtracting unit operable to subtract $b_w$ from $l_{wh}z_h$ (or subtract $l_{wh}z_h$ from $b_w$); and a divisional unit 670 operable to carry out ($z_w/d_{ww}$) to obtain $s_w$.

Step S136: executing Backward Substitution to process the aforementioned calculation values and thereby obtaining the wanted coefficients $c_w$ (w=n~1). More specifically, since $L^H$ (i.e., the upper triangular matrix) and the values $s_w$ derived from step S134 are in hand, the following equation is held true:

$[L]^H[C]=[S]$, that is to say $$\begin{bmatrix}1 & l_{21}^H & \cdots & l_{n1}^H\\ 0 & 1 & \cdots & l_{n2}^H\\ \vdots & \vdots & \vdots & \vdots\\ 0 & 0 & \cdots & 1\end{bmatrix}\begin{bmatrix}c_1\\c_2\\\vdots\\c_n\end{bmatrix}=\begin{bmatrix}s_1\\s_2\\\vdots\\s_n\end{bmatrix}$$

From the above equation, the coefficients $c_w$ (w=n~1) can be represented with the following equations:

$$c_n = s_n$$
$$c_{n-1} = s_{n-1} - l_{n,n-1}^H c_n$$
$$\vdots$$
$$c_1 = s_1 - \sum_{k=2}^{n} l_{k1}^H c_k$$
$$c_w = s_w - \sum_{k=w+1}^{n} l_{kw}^H c_k$$

Figure 7:
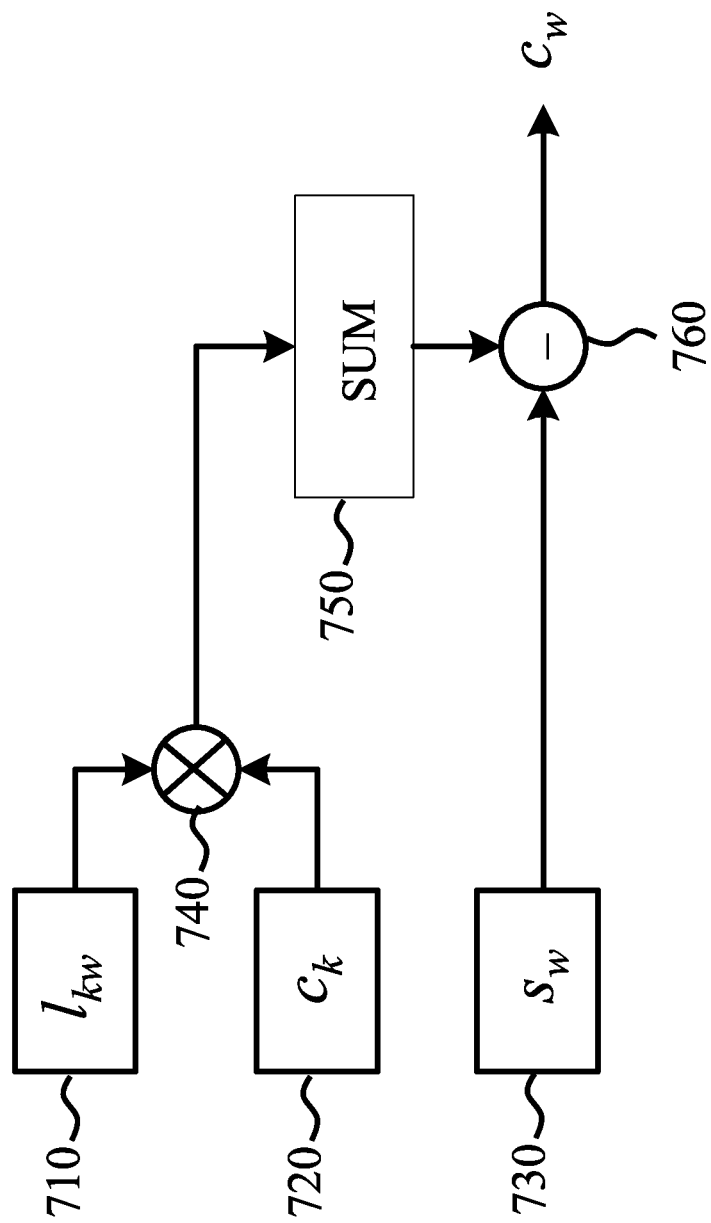
FIG. 7 illustrates an embodiment of the circuit operable to execute Backward Substitution according to the present invention.

The calculation of this step can be done by the circuit of FIG. 7 or the equivalent thereof, and can also be done through some other existing circuit (e.g., FPGA, microprocessor, or ASIC). The circuit of FIG. 7 includes: a circuitry unit 710 operable to provide $l_{kw}$; a circuitry unit 720 operable to provide $c_k$ that is outputted formerly; a circuitry unit 730 operable to provide $s_w$; a multiplying unit 740 operable to multiply $l_{kw}$ by $c_k$; an adding unit 750 (SUM) operable to add up $l_{kw}c_k$ (in which k is equal to (w+1)~n); a subtracting unit 760 operable to subtract $s_w$ from $l_{kw}c_k$ (or vice versa) to obtain the coefficients $c_w$.

In light of the above, after obtaining the plurality of coefficients $c_w$ (i.e., $c_1$~$c_n$), the pre-distortion circuit 120 can make use of the coefficients $c_w$ under the compensation mode to carry out a pre-distortion process to the inputted original digital signal, so as to compensate for the non-linear distortion of the analog circuit 130. FIG. 8 illustrates an embodiment of the pre-distortion circuit 120. As it is shown in FIG. 8, the pre-distortion circuit 120 includes a plurality of pre-distortion processing paths (e.g., $0^{th}$ path through $Q^{th}$ path in which Q is a positive integer) operable to execute different pre-distortion respectively in which the $q+1^{th}$ (while q is an integer between 0 and Q) path is operable to execute pre-distortion according to the $H_q$ of the aforementioned pre-distortion transformation matrix H and the coefficients $c_{q+1}$ ($c_{q+1} \in$ coefficients $c_w$). In detail, the $q+1^{th}$ pre-distortion processing path includes: a $q+1^{th}$ pre-distortion transformation processing unit 810 operable to carry out pre-distortion transformation to the inputted original digital signal according to the $H_q$ of the pre-distortion transformation matrix H and thereby generate a $q+1^{th}$ pre-distortion transformation signal; a $q+1^{th}$ multiplier 820 operable to multiply the $q+1^{th}$ pre-distortion transformation signal by the coefficient $c_{q+1}$ (which functions as a weighted value) to obtain a $q+1^{th}$ pre-distortion weighted signal; and an adder 830 (which is shared among all paths) operable to add up the $0^{th}$ pre-distortion weighted signal through the $Q^{th}$ pre-distortion weighted signal and thereby generate the said digital pre-distortion signal. Besides, in consideration of that different circuits may support different frequency bandwidths but could match each other, the pre-distortion circuit 120 may optionally include a filter (i.e., an adjustable low pass filter which is not shown in the figures) which is set between the pre-distortion transformation processing unit 810 and the multiplier 820 and operable to process the pre-distortion transformation signals, so as to confine the signal frequency bandwidth for circuit operation. Furthermore, in view of that the digital pre-distortion circuit of the present invention may suffer memory effects and thereby becomes sensitive to phase variation, therefore the said filter could be a zero-phase filter to prevent the influence of phase variation. People who are interested in the zero-phase filter may refer to the following document: Mitra, Sanjit K., "Digital Signal Processing", 2nd Ed., Secs. 4.4.2 and 8.2.5, New York: McGraw-Hill, 2001.

Figure 9:
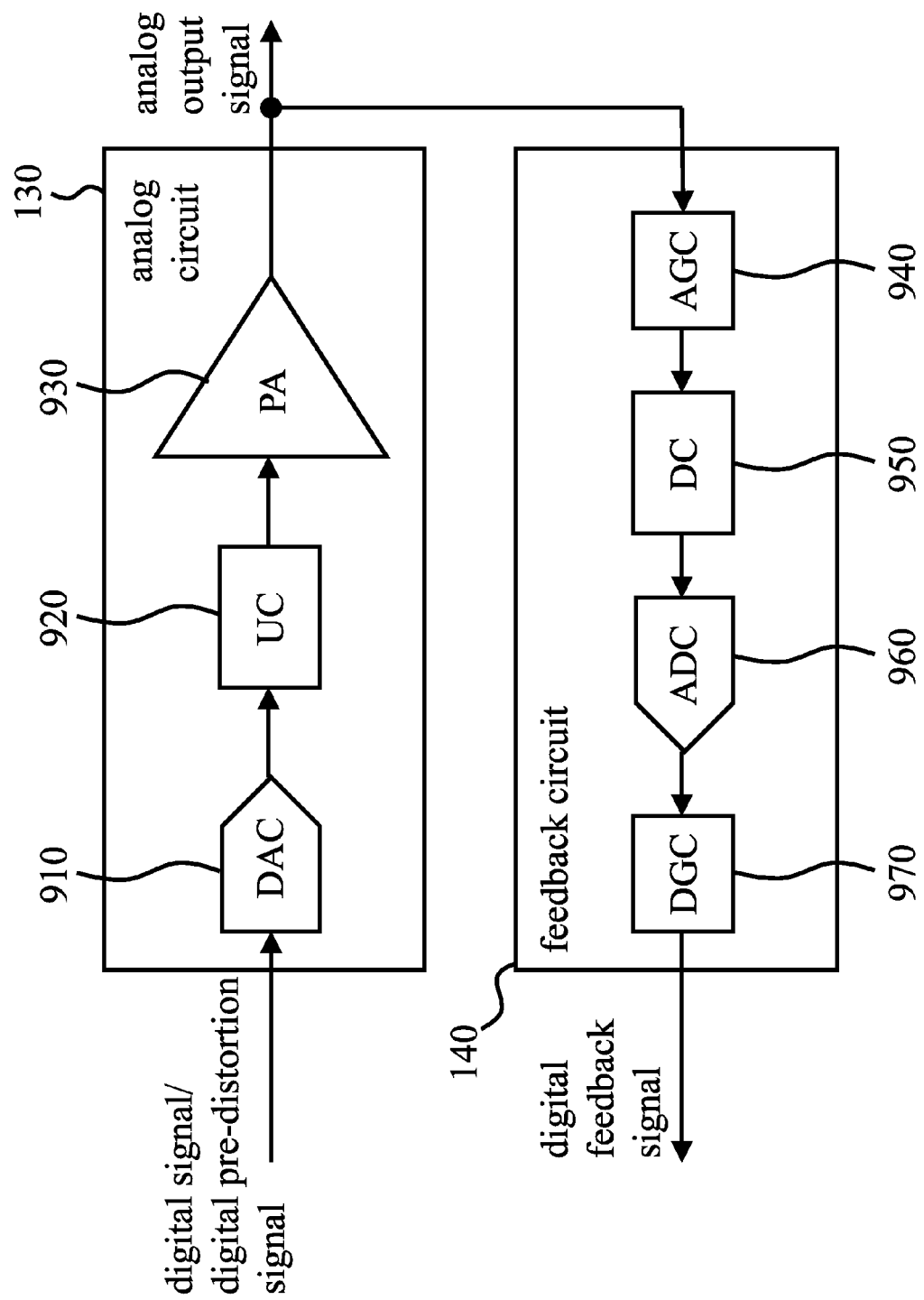
FIG. 9 illustrates an embodiment of the analog circuit and the feedback circuit of FIG. 1.

As it is mentioned in the preceding paragraphs, the digital pre-distortion circuit is applicable to a device having the problem of non-linear distortion while the configuration of the aforementioned analog circuit and feedback circuit might vary with the type of application. For instance, as it is shown in FIG. 9. If the digital pre-distortion circuit 100 of FIG. 1 is applied to a communication device (e.g., an OFDM (Orthogonal Frequency Division Multiplexing) communication device), the analog circuit 130 includes: a digital-to-analog converter (DAC) 910 operable to generate an analog signal according to the original digital signal (which bypasses the pre-distortion circuit 120 or is kept the same after passing it) under the normal mode or generate the analog signal according to the digital pre-distortion signal under the compensation mode; a frequency up-converter (UC) 920 operable to generate a frequency up-conversion signal according to the analog signal; and a power amplifier (PA) operable to generate the analog output signal of the analog circuit according to the frequency up-conversion signal. In addition, the feedback circuit 140 includes: an analog gain amplifier (AGC) 940 operable to adjust the gain of the analog output signal of the analog circuit 130; a frequency down-converter (DC) 950 operable to generate a frequency down-conversion signal according to the gain-adjusted signal from the analog gain amplifier 940; an analog-to-digital converter (ADC) 960 operable to generate the digital feedback signal according to the frequency down-conversion signal; and a digital gain controller (DGC) 970 operable to adjust the gain of the digital feedback signal and provides the gain-adjusted digital feedback signal for the pre-distortion training circuit 110. Since each of the said digital-to-analog converter 910, the frequency up-converter 920, the power amplifier 930, the analog gain controller 940, the frequency down-converter 950, the analog-do-digital converter 960 and the digital gain controller 970 alone can be carried out with a known or self-developed circuit by those of ordinary skill in the art, the detail of one single circuit is therefore omitted while the existing description is believed to be enough for understanding and enablement.

Figure 10:
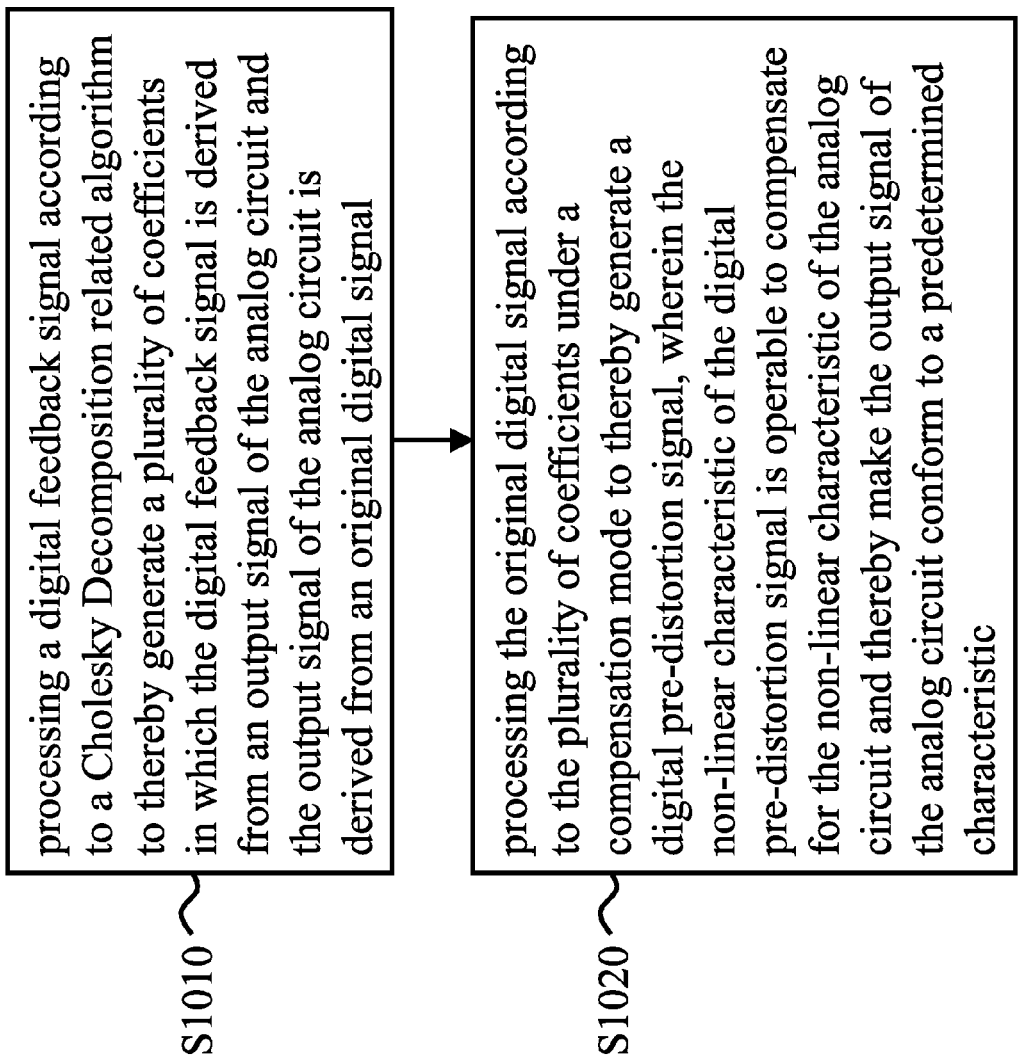
FIG. 10 illustrates an embodiment of the digital pre-distortion method of the present invention.

In addition to the above-disclosed digital pre-distortion circuit, the present invention also discloses a digital pre-distortion method which can be carried out by the digital pre-distortion circuit of the present invention or its equivalent and operable to compensate an analog circuit for its non-linear characteristic. As it is shown in FIG. 10, an embodiment of the said method comprises the following steps:

Step S1010: processing a digital feedback signal according to a Cholesky Decomposition related algorithm to thereby generate a plurality of coefficients in which the digital feedback signal is derived from an output signal of the analog circuit and the output signal of the analog circuit is derived from an original digital signal. This step can be carried out by the pre-distortion training circuit 110 of FIG. 1 or the equivalent thereof, and the detail and modification of this step can be found in the description of the aforementioned device invention.

Step S1020: processing the original digital signal according to the plurality of coefficients under a compensation mode to thereby generate a digital pre-distortion signal, wherein the non-linear characteristic of the digital pre-distortion signal is operable to compensate for the non-linear characteristic of the analog circuit and thereby make the output signal of the analog circuit conform to a predetermined characteristic (e.g., a linear characteristic or a characteristic abiding by a prescribed specification). This step can be carried out by the pre-distortion circuit 120 of FIG. 1 or the equivalent thereof, and the detail and modification of this step can also be found in the description of the aforementioned device invention.

Figure 11:
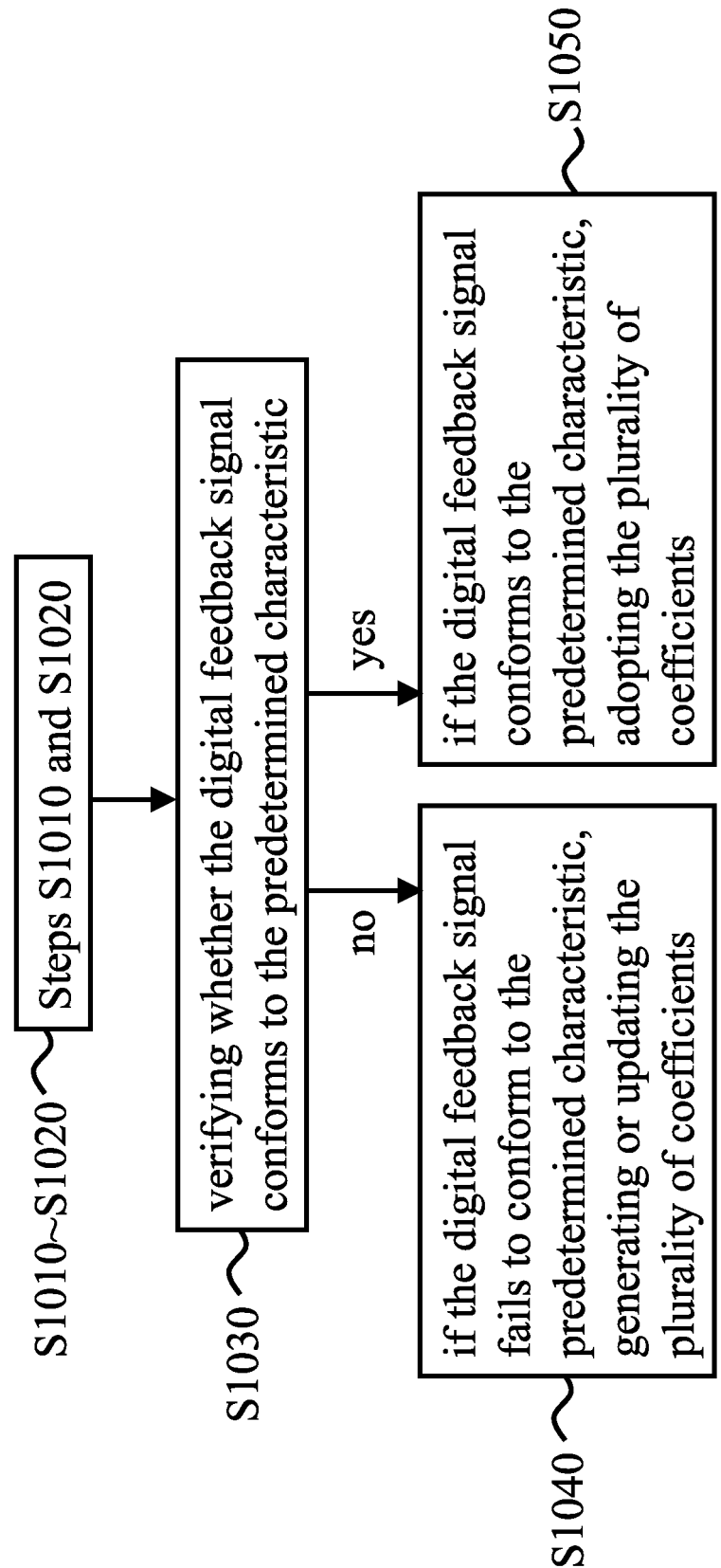
FIG. 11 illustrates another embodiment of the digital pre-distortion method of the present invention.

In order to verify whether the output signal of the analog circuit conforms to the predetermined characteristic, the present embodiment may further comprise the following steps (as shown in FIG. 11):

Step S1030: verifying whether the digital feedback signal conforms to the predetermined characteristic. This step can be executed by the aforementioned pre-distortion training circuit 110 with a known or self-developed statistical analysis algorithm (e.g., a linear regression analysis algorithm).

Step S1040: if the digital feedback signal fails to conform to the predetermined characteristic, generating or updating the plurality of coefficients. This step can be carried out by the aforementioned pre-distortion training circuit 110.

Step S1050: if the digital feedback signal conforms to the predetermined characteristic, adopting the plurality of coefficients. This step can be carried out by the aforementioned pre-distortion circuit 120.

In consideration of that those of ordinary skill in the art can appreciate the implementation detail and alteration of this method invention by referring to the description of the embodiments of the device invention, which means that the invention feature(s) of the embodiments of the device invention can be applied to any of the embodiments of this method invention in a reasonable way, the repeated and redundant explanation is therefore omitted while the existing description is believed to be sufficient for understanding and enablement.

In addition, because the pre-distortion training circuit 110 of FIG. 1 can be carried out independently and the output therefrom can be exploited by the implementer thereafter, the present invention further discloses a digital pre-distortion training circuit comprising: a pre-distortion training circuit (e.g., the pre-distortion training circuit 110 of FIG. 1) operable to process a digital feedback signal according to a Cholesky Decomposition related algorithm (e.g., the modified Cholesky Decomposition algorithm) and thereby generate a plurality of coefficients, wherein the digital feedback signal is derived from an analog output signal of an analog circuit and the plurality of coefficients is operable to compensate the analog circuit for its non-linear characteristic. As it is mentioned in the embodiment of FIG. 1, the pre-distortion training circuit may generate the plurality of coefficients by executing at least the following steps: obtaining a pre-distortion transformation matrix according to the digital feedback signal, the order of a memory polynomial and the depth of a memory effect; doing a matrix calculation according to the conjugate matrix of the pre-distortion transformation matrix, the pre-distortion transformation matrix and the original digital signal to thereby obtain a calculation result; and processing the calculation result according to the modified Cholesky Decomposition algorithm to thereby obtain the plurality of coefficients.

In view of that those of ordinary skill in the art can appreciate the implementation detail and alteration of this digital pre-distortion training circuit by referring to the description of the embodiment of FIG. 1, which means that the invention feature(s) of the pre-distortion training circuit 110 of FIG. 1 can be applied here in a reasonable way, the repeated and redundant explanation is therefore omitted while the existing description is believed to be sufficient for understanding and enablement.

In summary, the digital pre-distortion circuit, the digital pre-distortion method, and the digital pre-distortion training circuit are operable to carry out digital pre-distortion by using the Cholesky Decomposition related algorithm, and thereby compensate the non-linear distortion of an analog circuit while giving consideration to the memory effect of the analog circuit. Briefly, the present invention provides an effectual and cost-effective compensation solution against non-linear distortion.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A digital pre-distortion circuit capable of compensating for a non-linear characteristic of an analog circuit, comprising:
   a pre-distortion training circuit operable to process a digital feedback signal according to a modified Cholesky Decomposition algorithm and thereby generate a plurality of coefficients in which the digital feedback signal is derived from an output signal of the analog circuit and the output signal of the analog circuit is derived from an original digital signal; and
   a pre-distortion circuit, including the pre-distortion training circuit or being independent of the pre-distortion training circuit, operable to process the original digital signal according to the plurality of coefficients under a compensation mode and thereby generate a digital pre-distortion signal,
   wherein the non-linear characteristic of the digital pre-distortion signal is operable to compensate for the non-linear characteristic of the analog circuit and thereby make the output signal of the analog circuit conform to a predetermined characteristic, and the pre-distortion training circuit is operable to generate the plurality of coefficients through carrying out at least the following steps:
      obtaining a pre-distortion transformation matrix according to the digital feedback signal, the order of a memory polynomial and the depth of a memory effect;
      doing a calculation according to the conjugate matrix of the pre-distortion transformation matrix, the pre-distortion transformation matrix and the original digital signal to thereby obtain a calculation result; and
      processing the calculation result according to the modified Cholesky Decomposition algorithm to thereby obtain the plurality of coefficients.

2. The digital pre-distortion circuit of claim 1, wherein the pre-distortion training circuit processes the calculation result to obtain the plurality of coefficients by carrying out at least the following steps according to the modified Cholesky Decomposition algorithm:
   deriving a plurality of calculation values from the calculation result; and
   processing the plurality of calculation values through Forward and Backward Substitutions to thereby obtain the plurality of coefficients.

3. The digital pre-distortion circuit of claim 1, wherein the pre-distortion circuit includes a zero-phase filter operable to process a plurality of pre-distortion transformation signals which are derived from the original digital signal, and the digital pre-distortion signal is derived from the plurality of pre-distortion transformation signals.

4. The digital pre-distortion circuit of claim 1, wherein if the output signal of the analog circuit is derived from the digital pre-distortion signal, the pre-distortion training circuit further updates the plurality of coefficients according to the digital feedback signal, so that the plurality of coefficients adopted by the pre-distortion circuit is updated consequently.

5. The digital pre-distortion circuit of claim 1, further comprising:
   the analog circuit operable to generate the output signal of the analog circuit according to the original digital signal under a normal mode, and operable to generate the output signal of the analog circuit according to the digital pre-distortion signal under the compensation mode; and
   a feedback circuit operable to generate the digital feedback signal according to the output signal of the analog circuit.

6. The digital pre-distortion circuit of claim 5, wherein the analog circuit includes:
   a digital-to-analog converter operable to generate an analog signal according to the original digital signal or the digital pre-distortion signal;
   a frequency up-converter operable to generate a frequency up-conversion signal according to the analog signal; and
   a power amplifier operable to generate the output signal of the analog circuit according to the frequency up-conversion signal,
   and the feedback circuit includes:
   a frequency down-converter operable to generate a frequency down-conversion signal according to the output signal of the analog circuit; and
   an analog-to-digital converter operable to generate the digital feedback signal according to the frequency down-conversion signal.

7. The digital pre-distortion circuit of claim 1, wherein the digital pre-distortion training circuit further includes:
   a timing aligning circuit operable to verify a timing relation between the original digital signal and the digital feedback signal,
   in which the pre-distortion training circuit is operable to process the digital feedback signal according to the timing relation.

8. A digital pre-distortion method carried out by a digital pre-distortion circuit and capable of compensating for a non-linear characteristic of an analog circuit, comprising the following steps:
   processing a digital feedback signal according to a modified Cholesky Decomposition algorithm to thereby generate a plurality of coefficients in which the digital feedback signal is derived from an output signal of the analog circuit and the output signal of the analog circuit is derived from an original digital signal; and processing the original digital signal according to the plurality of coefficients under a compensation mode to thereby generate a digital pre-distortion signal, wherein the non-linear characteristic of the digital pre-distortion signal is operable to compensate for the non-linear characteristic of the analog circuit and thereby make the output signal of the analog circuit conform to a predetermined characteristic, and the step of processing the digital feedback signal according to the modified Cholesky Decomposition algorithm includes:

obtaining a pre-distortion transformation matrix according to the digital feedback signal, the order of a memory polynomial and the depth of a memory effect;

doing a matrix calculation according to the conjugate matrix of the pre-distortion transformation matrix, the pre-distortion transformation matrix and the original digital signal to thereby obtain a calculation result; and processing the calculation result according to the modified Cholesky Decomposition algorithm to thereby obtain the plurality of coefficients.

9. The digital pre-distortion method of claim 8, wherein the step of obtaining the plurality of coefficients by processing the calculation result according to the modified Cholesky Decomposition algorithm includes:

deriving a plurality of calculation values from the calculation result; and processing the plurality of calculation values through Forward and Backward Substitutions to thereby obtain the plurality of coefficients.

10. The digital pre-distortion method of claim 8, further comprising:

using a zero-phase filter to process a plurality of pre-distortion transformation signals which are derived from the original digital signal, and the digital pre-distortion signal is derived from the plurality of pre-distortion transformation signals.

11. The digital pre-distortion method of claim 8, further comprising:

if the output signal of the analog circuit is derived from the digital pre-distortion signal, processing the digital feedback signal according to the modified Cholesky Decomposition algorithm to thereby update the plurality of coefficients.

12. The digital pre-distortion method of claim 8, further comprising:

generating the output signal of the analog circuit according to the original digital signal under a normal mode;

generating the output signal of the analog circuit according to the digital pre-distortion signal under the compensation mode; and generating the digital feedback signal according to the output signal of the analog circuit.

13. The digital pre-distortion method of claim 8, further comprising:

verifying a timing relation between the original digital signal and the digital feedback signal, in which the step of processing the digital feedback signal is carried out in accordance with the timing relation.

14. The digital pre-distortion method of claim 8, further comprising:

verifying whether the digital feedback signal conforms to the predetermined characteristic;

if the digital feedback signal fails to conform to the predetermined characteristic, generating or updating the plurality of coefficients; and if the digital feedback signal conforms to the predetermined characteristic, adopting the plurality of coefficients.

15. A digital pre-distortion training circuit, comprising:

a pre-distortion training circuit operable to process a digital feedback signal according to a modified Cholesky Decomposition algorithm and thereby generate a plurality of coefficients through carrying out at least the following steps:

obtaining a pre-distortion transformation matrix according to the digital feedback signal, the order of a memory polynomial and the depth of a memory effect;

doing a matrix calculation according to the conjugate matrix of the pre-distortion transformation matrix, the pre-distortion transformation matrix and the original digital signal to thereby obtain a calculation result; and processing the calculation result according to the modified Cholesky Decomposition algorithm to thereby obtain the plurality of coefficients, wherein the digital feedback signal is derived from an output signal of an analog circuit and the plurality of coefficients is operable to compensate for a non-linear characteristic of the analog circuit.

* * * * *